United States Patent
Tabata

(10) Patent No.: US 7,733,721 B2
(45) Date of Patent: Jun. 8, 2010

(54) SEMICONDUCTOR TESTING DEVICE AND METHOD OF TESTING SEMICONDUCTOR MEMORY

(75) Inventor: Makoto Tabata, Tokyo-To (JP)

(73) Assignee: Advantest Corporation, Tokyo (JP)

( * ) Notice: Subject to any disclaimer, the term of this patent is extended or adjusted under 35 U.S.C. 154(b) by 270 days.

(21) Appl. No.: 11/991,368

(22) PCT Filed: Aug. 22, 2007

(86) PCT No.: PCT/JP2007/066262

§ 371 (c)(1),
(2), (4) Date: Mar. 3, 2008

(87) PCT Pub. No.: WO2008/050527

PCT Pub. Date: May 2, 2008

(65) Prior Publication Data

US 2010/0034037 A1    Feb. 11, 2010

(30) Foreign Application Priority Data

Oct. 26, 2006  (JP) .............................. 2006-290893

(51) Int. Cl.
*G11C 7/00* (2006.01)

(52) U.S. Cl. .................. 365/201; 365/200; 365/189.01; 365/230.03

(58) Field of Classification Search ................. 365/201, 365/200, 230.03

See application file for complete search history.

(56) References Cited

U.S. PATENT DOCUMENTS

| 6,885,956 | B2* | 4/2005 | Baba ............................ 702/83 |
| 7,240,256 | B2* | 7/2007 | Yamane ....................... 714/723 |
| 7,395,473 | B2* | 7/2008 | Cheng et al. ................ 714/729 |
| 2010/0008170 | A1* | 1/2010 | Sato et al. .................... 365/201 |

FOREIGN PATENT DOCUMENTS

| JP | 8-273391 A | 10/1996 |
| JP | 2004-117055 A | 4/2004 |
| JP | 2004-117056 A | 4/2004 |
| WO | WO-2008/050527 A1 | 5/2008 |

* cited by examiner

*Primary Examiner*—Connie C Yoha
(74) *Attorney, Agent, or Firm*—Birch, Stewart, Kolasch & Birch, LLP

(57) ABSTRACT

The disclosure concerns a semiconductor tester for testing a MUT, comprising a pattern generator; a pattern formatter; a comparator comparing a result signal from the MUT with an expectation value; a bad block memory; an AFM pre-storing pass/fail information of each of memory cells; a data compressor compressing data of pass/fail information in the AFM; a compression failure buffer memory storing data compressed; a good block register storing an address number of a good block prepared; and an address generator, wherein when the block to be compressed is a good one, the good block register sends a address number of the good block to the compress failure buffer memory.

7 Claims, 4 Drawing Sheets

SEMICONDUCTOR TESTING DEVICE AND METHOD OF TESTING SEMICONDUCTOR MEMORY

BACKGROUND OF THE INVENTION

1. Field of the Invention

The present invention relates to a semiconductor testing device and, for example, to a semiconductor testing device for testing a memory of a data storage type the quality of which is controlled blockwise if a device is good or not such as a NAND-type flash memory.

2. Related Art

A semiconductor memory testing device has a timing generator, a pattern generator, a pattern formatter, and a logic comparator. The timing generator generates a reference clock from timing data designated by a timing set signal (hereinbelow, called TS signal) output from the pattern generator. The pattern generator outputs test pattern data to be given to a memory under test (MUT) synchronously with the reference clock from the timing generator. The test pattern data is given to the pattern formatter. The pattern formatter shapes the test pattern data to a waveform of a timing necessary for a test, and applies the shaped test signal to the memory under test. A result signal output from the memory under test is supplied to the logic comparator. The logic comparator compares expectation value data from the pattern generator and the result signal from the memory under test to determine whether the memory under test is good or not on the basis of the result of comparison.

In recent years, as the packing density of a semiconductor memory increases, various problems occur in the semiconductor memory. To solve the problems early, analysis is conducted from a wafer fail bitmap or the like at a wafer level. The wafer fail bitmap is generated from pass/fail data of a device at a wafer process stage stored in an AFM (Address-based Failure Memory). Since the amount of the data is large (for example, 1 Gbit or larger), usually, the semiconductor testing device obtains the failure data of a device at the wafer process stage from the AFM, compresses the data, and stores the compressed data into a CFBM (Compression Fail Buffer Memory). The compressed data is used to generate a wafer fail bitmap and test a semiconductor memory.

However, as the capacity of a semiconductor memory increases, the data compression time is becoming longer. A problem arises such that the period since data is read from the AFM until compressed data is stored in the CFBM is becoming longer.

SUMMARY OF THE INVENTION

A semiconductor testing device according to an embodiment of the present invention, the device for testing a memory under test in which a page is made of a plurality of bits stored in a plurality of memory cells and data can be erased block by block, the block being made of a plurality of the pages, the device comprising: a pattern generator generating a test pattern; a pattern formatter shaping the test pattern and outputting a test signal; a comparator comparing a result signal with an expectation value, the result signal being output from the memory under test receiving the test signal; a bad block memory pre-storing pass/fail information of each of blocks in the memory under test, when a block to be tested is not a good one, outputting an instruction to inhibit an operation of outputting the test signal to the pattern formatter, and also outputting an instruction to inhibit an operation of comparing the result signal with the expectation value to the comparator; an address fail memory pre-storing pass/fail information of each of memory cells of the memory under test; a data compressor compressing data of pass/fail information in the address fail memory; a compression failure buffer memory storing data compressed by the data compressor; a good block register storing an address number of a good block prepared; and an address generator generating an address of a block to be compressed and sending the block address to the bad block memory, the address generator generating a column address and a row address of a page in the block address, when the block to be compressed which is indicated by the address of the block to be compressed is not a good one, wherein when the block to be compressed which is indicated by the address of the block to be compressed is not a good one, the address generator sends a column address and a row address of a page in the block to be compressed to the address fail memory and, when the block to be compressed is a good one, the good block register sends a address number of the good block to the compress failure buffer memory.

When a block to be tested indicated by the address of the block to be tested is not a good one, the compression failure buffer memory outputs pass/fail information of the memory cell to the data compressor on the basis of the column address and the row address sent from the address generator, the data compressor compresses the pass/fail information of the memory cell, and the compression failure buffer memory stores the compressed pass/fail information of the memory cell.

When the block to be compressed is a good one, the address generator does not generate a column address and a row address of a page in the block to be compressed.

A method of testing a memory under test by using a semiconductor testing device according to an embodiment of the present invention, the memory under test in which a page is made of a plurality of bits stored in a plurality of memory cells and data can be rewritten block by block, the block being made of a plurality of the pages, the semiconductor testing device comprises: a bad block memory pre-storing pass/fail information of each of blocks in the memory under test; an address fail memory pre-storing pass/fail information of each of memory cells of the memory under test; a data compressor compressing data of pass/fail information of the memory cells; a compression failure buffer memory storing data compressed by the data compressor; a good block register storing an address number of a good block prepared; and an address generator generating an address of a block to be compressed and a column address and a row address of a page in the block address, and the method comprises a step of, when a block to be compressed which is indicated by the address of the block to be compressed is not a good one, sending a column address and a row address of a page in the block to be compressed to the address fail memory by the address generator and, when the block to be compressed is a good one, sending the address number of the good block to the compress failure buffer memory by the good block register.

when the block to be tested is not a good one, a step of outputting pass/fail information of the memory cell from the compression failure buffer memory on the basis of the column address and the row address sent from the address generator to the data compressor;

a step of compressing the pass/fail information of the memory cell in the data compressor, and a step of storing the compressed pass/fail information of the memory cell into the compression failure buffer memory.

A semiconductor testing device according to an embodiment of the present invention, the device testing a device under test having at least a flash memory in which memory cells are managed on a block unit basis, comprising:

an address fail memory storing pass/fail information obtained by testing each of the memory cells of the device under test;

a good block register storing information indicating that no bad memory cell exists in each of the block units, which is obtained by testing the each memory cells in the device under test; and a data compressor receiving pass/fail information stored in the address fail memory and compressing data which is applied to a repairing process, wherein when the information of the good block register indicates absence of a bad memory cell, the data compressor skips reading of the pass/fail information stored in the address fail memory.

The present invention can provide a semiconductor testing device realizing reduction in compression time of pass/fail data of a device at a wafer process stage at the time of generating a wafer fail bitmap.

DETAILED DESCRIPTION OF THE INVENTION

The present invention will be described hereinbelow by using an embodiment of the invention. The embodiment does not limit the present invention in the scope of claims, and all of combinations of features described in the embodiment are not always necessary for the solving means of the present invention.

Figure 1:
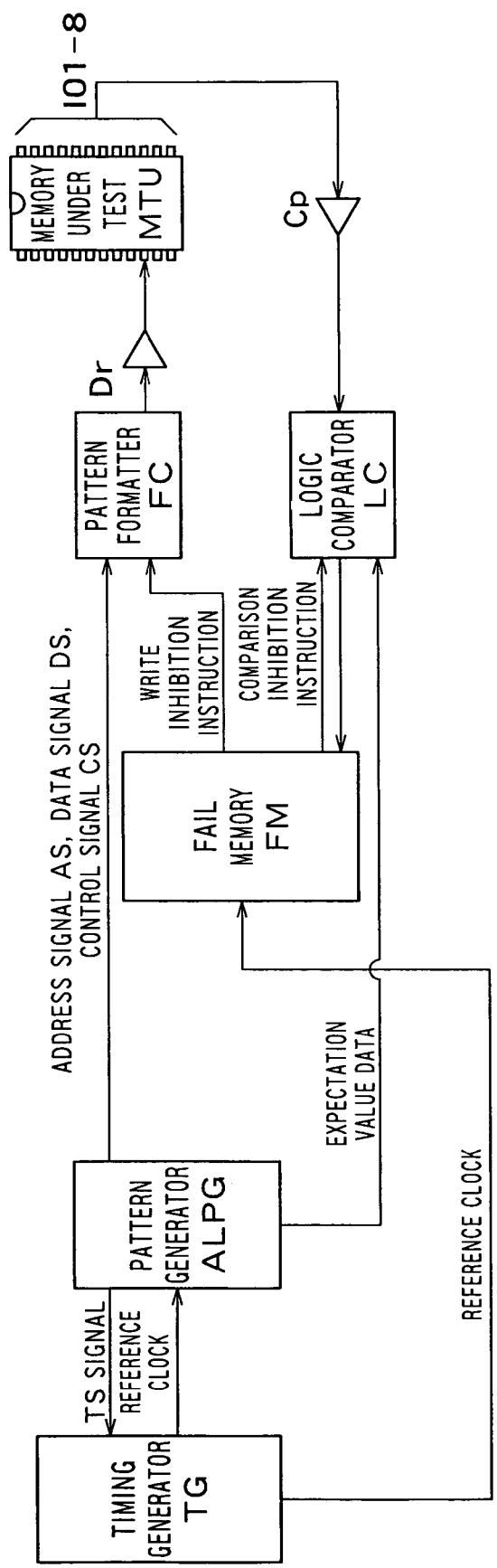
FIG. 1 is a block diagram of a semiconductor testing device 100 of the embodiment of the invention.

FIG. 1 is a block diagram of a semiconductor testing device 100 (hereinbelow, device 100) of the embodiment of the invention.

The device 100 has a timing generator TG, a pattern generator ALPG, a pattern formatter FC, a logic comparator LC, and a failure buffer memory FM. The pattern generator ALPG outputs a timing set signal (TS signal) to the timing generator TG. The timing generator TG receives the TS signal and generates timing edges of a number of various channels specified on the basis of timing sets described in a device test program. With the timing edge, the timing generator TG generates a reference clock. The pattern generator ALPG generates address information of a memory cell in the memory under test MUT and, synchronously with the reference clock, outputs test pattern data to be given to the memory cell.

The pattern formatter FC shapes the test pattern data into a waveform of a timing necessary for a test, and applies the shaped test pattern to the memory under test MUT in accordance with the address information.

The memory under test MUT receives a test signal, writes predetermined data into a memory cell and, further, reads the data. The memory under test MUT is constructed so that a page is made of a plurality of bits stored in a plurality of memory cells, data is written on the page unit basis, and data can be erased by block made of a plurality of pages. For example, the memory under test MUT is a memory of a data storage type such as a NAND-type flash memory having block function. Whether the memory of the data storage type is conforming or not is controlled on the block unit basis. A signal read from the memory under test MUT is supplied to the logic comparator LC. The logic comparator LC compares expectation value data from the pattern generator ALPG with the result signal output from the memory under test MUT and, on the basis of the result of comparison, determines whether the memory under test MUT is conforming or not. The comparison result of the logic comparator LC is stored address by address in the address-based failure memory AFM in the failure memory FM. The address-based failure memory AFM is constructed to store the result of comparison of all of the bits of the memory under test MUT. The address-based failure memory AFM stores pass/fail information obtained by testing each of the memory cells of a device to be tested. The address-based failure memory AFM is used for other processes to see whether the memory under test MUT can be repaired or not depending on the disposition conditions of the number of failure cells in the memory under test MUT, each of blocks can be repaired or not, and the memory under test MUT is determined as a conforming memory or not on the basis of the number of failure blocks. Usually, even if a few percents of failure blocks exist, the device is determined as a conforming device.

Before a test of the memory under test MUT, the address-based failure memory AFM stores result data of a test at the wafer process stage.

Generation of compression data used for generating a wafer fail bitmap will be described hereinbelow.

Figure 2:
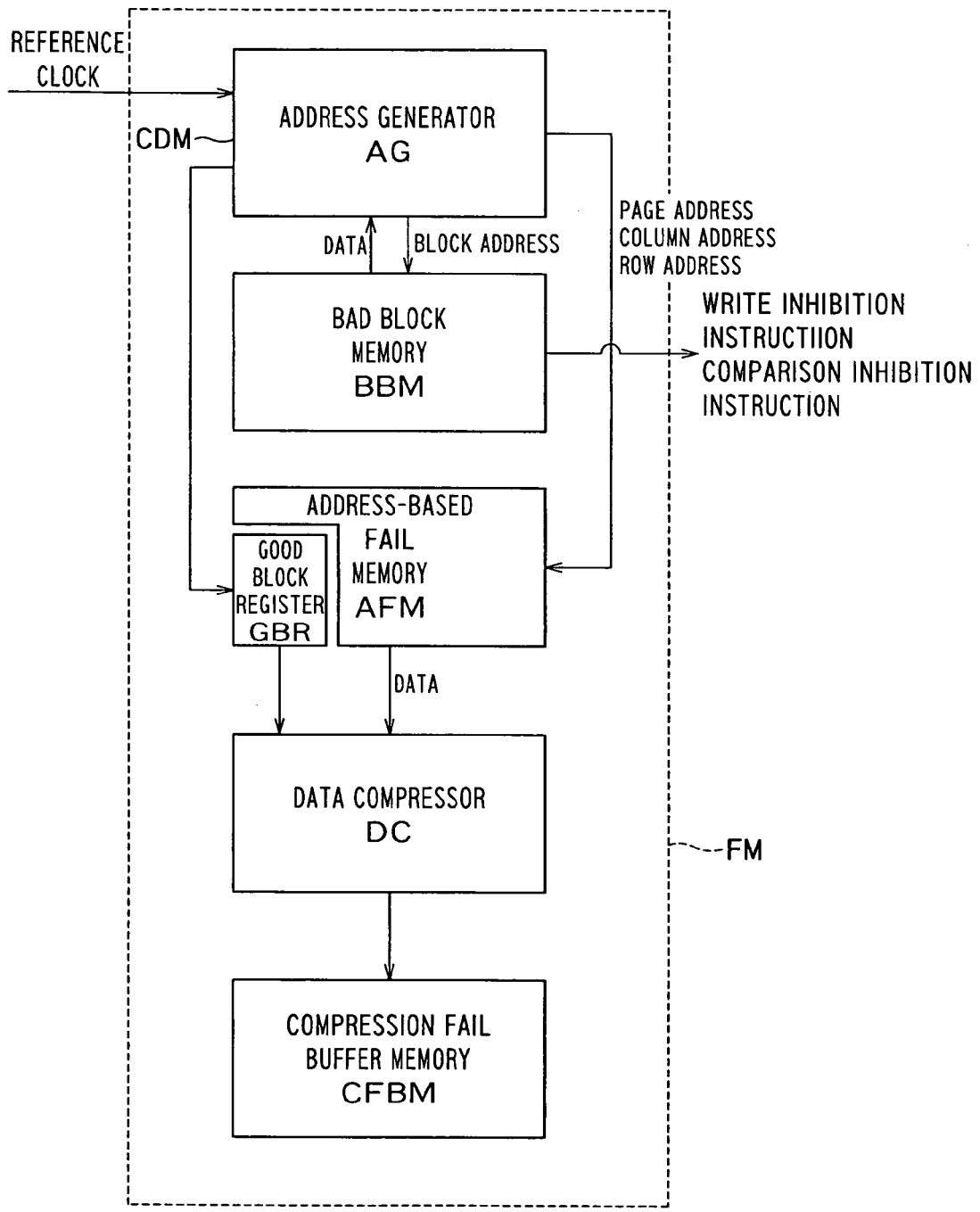
FIG. 2 is a block diagram showing an internal configuration of the failure memory FM.

FIG. 2 is a block diagram showing an internal configuration of the failure memory FM. An address generator AG receives a reference clock from the timing generator TG and generates a block address, a page address, a column address, a row address, and the like. A good block register GBR stores the number of addresses of prepared good blocks. The good block register GBR may store information indicating that no failure memory cell exists in each of the block units, which is obtained by testing each of memory cells in the memory under test MUT. When a block is a good one, there is no failure memory cell. Consequently, compression data of a good block can be easily generated when the address number of the good block is turned out. Therefore, in the case where data of a bad block memory BBM indicates a good block, the address generator AG does not generate a column address and a row address, but the good block register sends the address number to the compression failure buffer memory CFBM. It is sufficient for the compression failure buffer memory CFBM to generate and store compression data of the good block on the basis of the address number. It becomes unnecessary to perform the good block compressing operation.

The good block register GBR may be provided on the inside of a data compressor DC or separately from the data compressor DC. Obviously, the good block register GBR may be provided as a part of the bad block memory BBM, the address-based failure memory AFM, or the compression failure buffer memory CFBM, or may be provided on the outside of the failure memory FM.

When a block is not a good one, the address generator AG sequentially generates a column address and a row address of a page in a block to be compressed. The column address and the row address are sent to the address-based failure memory AFM.

The bad block memory BBM is a memory for management provided on the semiconductor testing device 100 side and pre-stores data indicative of pass/fail of each of blocks of the memory under test MUT. The pass/fail data is result data of a test at the wafer process stage. For example, data indicating whether a block is good or not can be expressed by data of one bit. Therefore, the bad block memory BBM may be constructed by a memory having memory capacity equal to or larger than the number of blocks of a memory under test and having capacity equal to or larger than one bit for each block address. By using data stored in the bad block memory BBM, whether a block to be tested is a conforming block (good block) or not can be determined easily and immediately. Based on the result of saving process such as the repairing process, final block pass/fail information is written in a bad block memory in the memory under test.

The bad block memory BBM is constructed to output pass/fail data of a block to be compressed to the address generator AG. The address generator AG determines whether a block to be compressed is a good block or not on the basis of the value of the pass/fail data (binary value of "1" or "0"). For example, when the block to be compressed is a good block ("0"), the address generator AG activates a signal to the good block register GBR. At that time the address generator AG does not generate a page address, a column address, and a row address. That is, the address generating process is made unnecessary. By activation of the signal to the good block register GBR, the good block register GBR outputs the address number of prepared good blocks to the compression failure buffer memory CFBM.

On the other hand, when a block to be compressed is not a good block ("1"), the address generator AG generates a page address, a column address, and a row address. At this time, the address generator AG makes the signal to the good block register GBR remain inactive. Therefore, the good block register GBR does not output the address number.

The address-based failure memory AFM pre-stores pass/fail information of each of the memory cells of the memory under test MUT. The pass/fail information is also result data of a test at the wafer process stage. When the block to be compressed is not a good block, the address-based failure memory AFM sends data of a memory cell designated by the page address, the column address, and the row address from the address generator AG to the data compressor DC.

When the block to be compressed is not a good block, the data compressor DC receives data of pass/fail information of each of the memory cells from the address-based failure memory AFM and compresses it. As the compression format, an existing standard may be used. After data compression, the data compressor DC sends compressed data to the compression failure buffer memory CFBM. On the other hand, when the block to be compressed is a good block, no page address and the like is generated from the address generator AG, so that data in the address fail memory AFM is not sent to the data compressor DC. That is, the compressing operation is not substantially performed. The compressed data is applied to a repairing process.

The compression failure buffer memory CFBM stores the number of addresses from the good block register GBR and compressed data from the data compressor DC. The compressed data is used to generate a wafer fail bitmap and to test a semiconductor memory.

Figure 3:
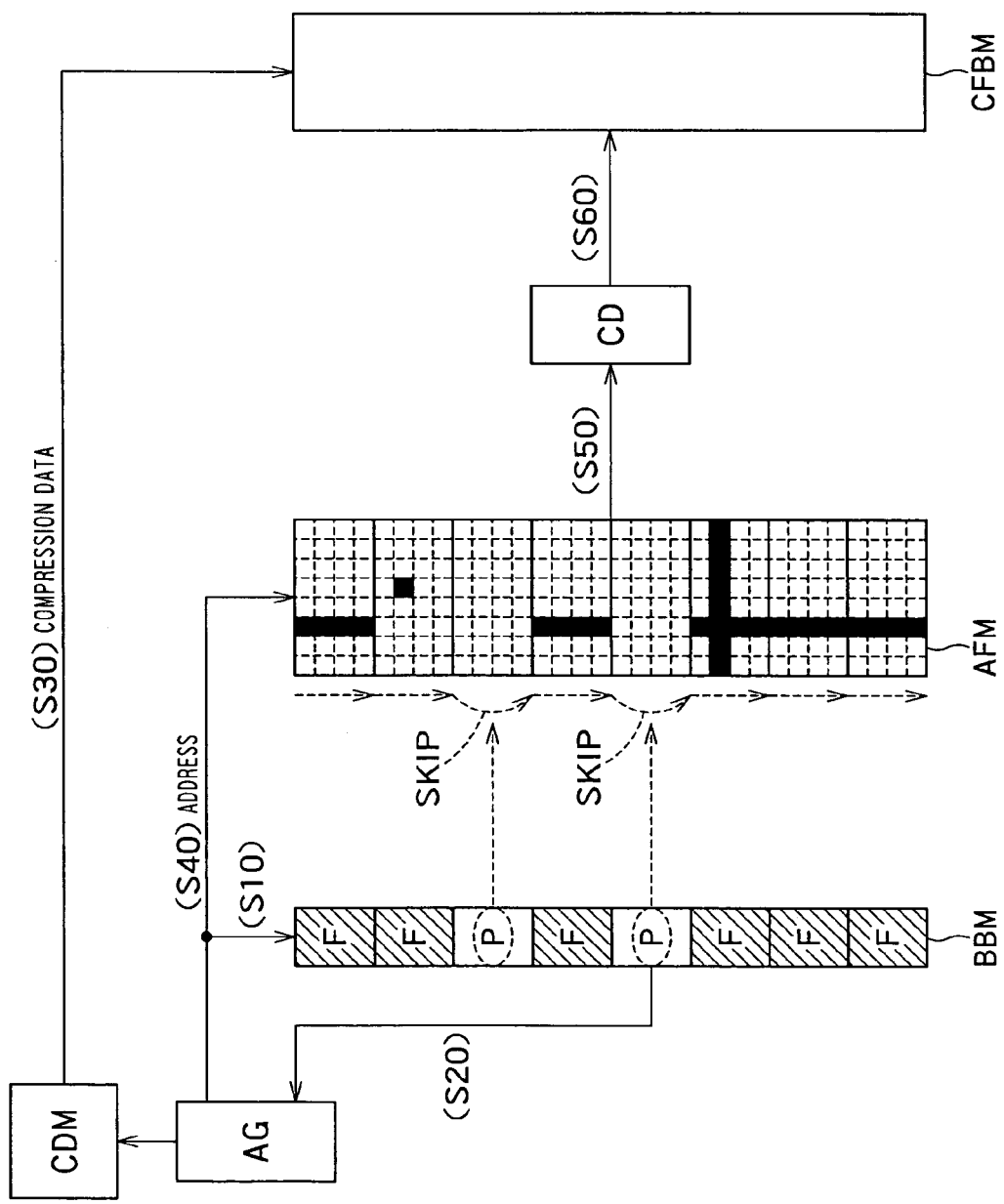
FIG. 3 is a conceptual diagram showing the compression data generating method of the embodiment.
Figure 4:
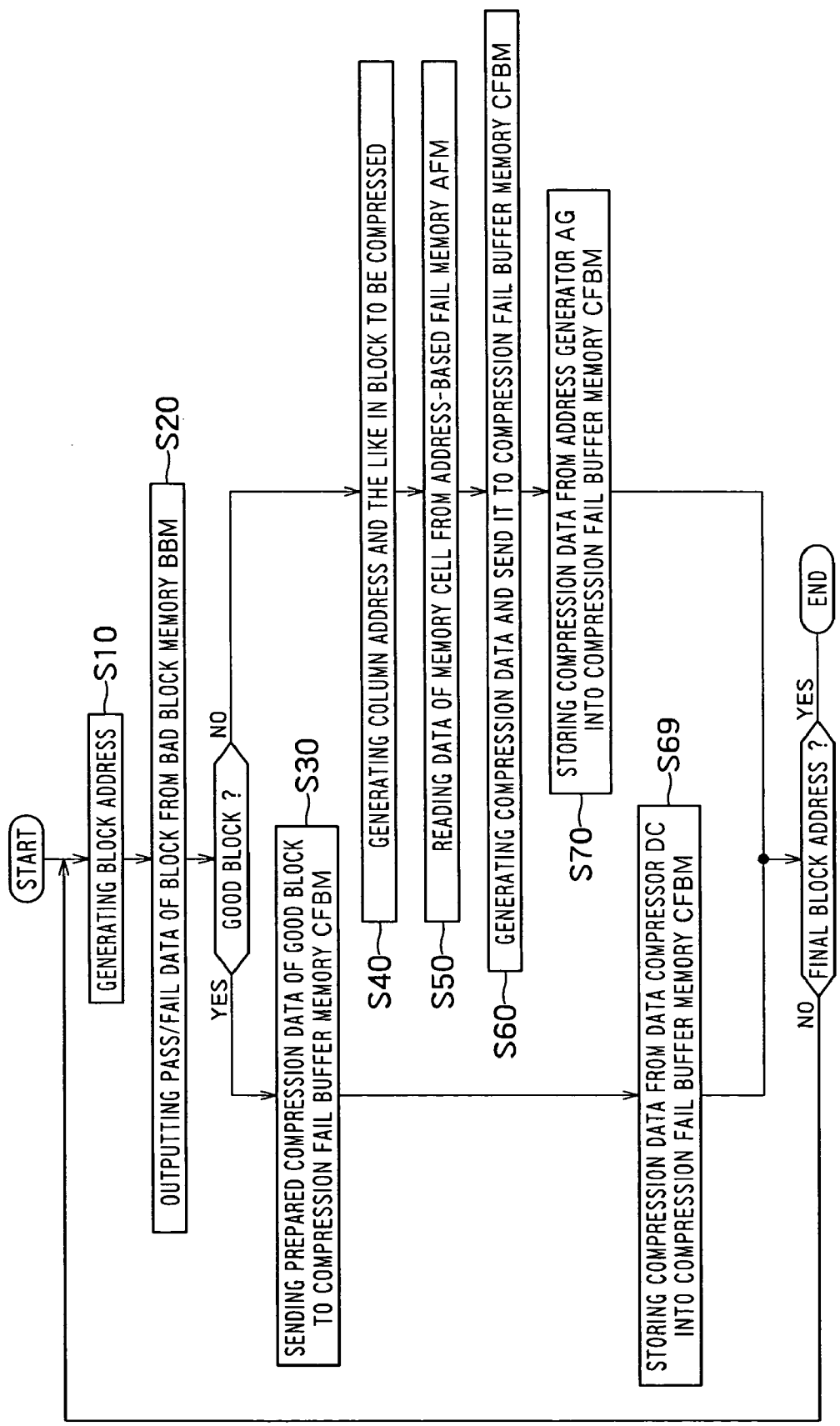
FIG. 4 is a flowchart showing the compression data generating method of the embodiment.

FIG. 3 is a conceptual diagram showing the compression data generating method of the embodiment. FIG. 4 is a flowchart showing the compression data generating method of the embodiment. Referring to FIGS. 3 and 4, the compression data generating method of the embodiment will be described.

In the initial state, pass/fail data of each of memory cells at the wafer process stage is stored in the address-based failure memory AFM, and pass/fail data of each of blocks is stored in the bad block memory BBM.

First, the address generator AG generates a block address (S10). The block address is sent to the bad block memory BBM. The bad block memory BBM outputs pass/fail data of a block indicated by a block address (S20).

When the block to be compressed is a good block, the good block register GBR sends the address number of the good block previously prepared to the compression failure buffer memory CFBM (S30). At this time, the address generator AG increments the block address without generating a page address, a column address, and a row address. As a result, the operation of compressing a good block is skipped, and a block indicated by the following block address becomes the target of compression. At this time, the data compressor DC does not perform the good block compressing operation. Alternatively, in the case where the information of the good block register GBR indicates the absence of a bad memory cell, the data compressor DC may skip not only the compressing operation but also reading of pass/fail information stored in the address-based failure memory AFM. Thus, the test period can be further shortened.

On the other hand, when a block to be compressed is not a good one, the address generator AG generates the page address, the column address, and the row address in the block in the address order synchronously with the reference clock (S40). The page address, the column address, and the row address are sent to the address-based failure memory AFM. The data compressor DC reads data of a memory cell indicated by the page address, the column address, and the row address from the address-based failure memory AFM (S50). The data compressor DC counts data of the memory cells in the address order and generates compression data of the data. The compression data is sent to the compression failure buffer memory CFBM (S60).

When a block to be compressed is a good one, the compression failure buffer memory CFBM receives compression data of a good block from the data compressor DC and stores it (S69). When a block to be compressed is not a good one, the compression failure buffer memory CFBM receives the compression data from the data compressor DC and stores it (S70).

The operations in steps S10 to S70 are executed on each of the blocks. After the block address reaches the final block address, the compressing operation is finished.

After that, the compression data in the compression failure buffer memory CFBM is used to generate a wafer fail bitmap used for a test of the memory under test MUT. The pass/fail data in the bad block memory BBM is used at the time of a test of the memory under test MUT after the data compression. When the block to be tested is not a good block, the bad block memory BBM outputs a write inhibition instruction for inhibiting an operation of writing test data to the pattern formatter FC and outputs a comparison inhibition instruction to inhibit comparison between a result signal and a reference value to the logic comparator LC. With the configuration, the device 100 can shift a test to a block of the following address without executing a test of the good block. As a result, test time can be shortened.

In the embodiment, when a block to be compressed is a good one, without compressing the data of the block, data of the address number preliminarily stored in the good block register GBR is sent to the compression failure buffer memory CFBM. Since a block to be compressed is skipped at this time, time of compression of a good block is made unnecessary. As a result, at the time of generating a wafer fail bitmap, the time of compression of pass/fail data of a device at the wafer process stage stored in the address-based failure memory AFM can be shortened. The present invention is not limited to a memory under test but can be applied to other devices to be tested each including a flash memory.

What is claimed is:

1. A semiconductor testing device for testing a memory under test in which a page is made of a plurality of bits stored in a plurality of memory cells and data can be erased block by block, the block being made of a plurality of the pages, comprising:
    a pattern generator generating a test pattern;
    a pattern formatter shaping the test pattern and outputting a test signal;
    a comparator comparing a result signal with an expectation value, the result signal being output from the memory under test receiving the test signal;
    a bad block memory pre-storing pass/fail information of each of blocks in the memory under test, when a block to be tested is not a good one, outputting an instruction to inhibit an operation of outputting the test signal to the pattern formatter, and also outputting an instruction to inhibit an operation of comparing the result signal with the expectation value to the comparator;
    an address fail memory pre-storing pass/fail information of each of memory cells of the memory under test;
    a data compressor compressing data of pass/fail information in the address fail memory;
    a compression failure buffer memory storing data compressed by the data compressor;
    a good block register storing an address number of a good block prepared; and
    an address generator generating an address of a block to be compressed and sending the block address to the bad block memory, the address generator generating a column address and a row address of a page in the block address, when the block to be compressed which is indicated by the address of the block to be compressed is not a good one,
    wherein when the block to be compressed which is indicated by the address of the block to be compressed is not a good one, the address generator sends a column address and a row address of a page in the block to be compressed to the address fail memory and,
    when the block to be compressed is a good one, the good block register sends a address number of the good block to the compress failure buffer memory.

2. The semiconductor testing device according to claim 1, wherein when a block to be tested indicated by the address of the block to be tested is not a good one, the compression failure buffer memory outputs pass/fail information of the memory cell to the data compressor on the basis of the column address and the row address sent from the address generator,
    the data compressor compresses the pass/fail information of the memory cell, and
    the compression failure buffer memory stores the compressed pass/fail information of the memory cell.

3. The semiconductor testing device according to claim 1, wherein when the block to be compressed is a good one, the address generator does not generate a column address and a row address of a page in the block to be compressed.

4. A method of testing, by using a semiconductor testing device, a memory under test in which a page is made of a plurality of bits stored in a plurality of memory cells and data can be rewritten block by block, the block being made of a plurality of the pages,
    the semiconductor testing device comprises: a bad block memory pre-storing pass/fail information of each of blocks in the memory under test; an address fail memory pre-storing pass/fail information of each of memory cells of the memory under test; a data compressor compressing data of pass/fail information of the memory cells; a compression failure buffer memory storing data compressed by the data compressor; a good block register storing an address number of a good block prepared; and an address generator generating an address of a block to be compressed and a column address and a row address of a page in the block address, and
    the method comprises a step of, when a block to be compressed which is indicated by the address of the block to be compressed is not a good one, sending a column address and a row address of a page in the block to be compressed to the address fail memory by the address generator and,
    when the block to be compressed is a good one, sending the address number of the good block to the compress failure buffer memory by the good block register.

5. The method according to claim 4, further comprising:
    when the block to be tested is not a good one,
    a step of outputting pass/fail information of the memory cell from the compression failure buffer memory on the basis of the column address and the row address sent from the address generator to the data compressor;
    a step of compressing the pass/fail information of the memory cell in the data compressor, and
    a step of storing the compressed pass/fail information of the memory cell into the compression failure buffer memory.

6. The semiconductor testing device according to claim 4, wherein when the block to be compressed is a good one, the address generator does not generate a column address and a row address of a page in the block to be compressed.

7. A semiconductor testing device testing a device under test having at least a flash memory in which memory cells are managed on a block unit basis, comprising:
    an address fail memory storing pass/fail information obtained by testing each of the memory cells of the device under test;
    a good block register storing information indicating that no bad memory cell exists in each of the block units, which is obtained by testing the each memory cells in the device under test; and
    a data compressor receiving pass/fail information stored in the address fail memory and compressing data which is applied to a repairing process,
    wherein when the information of the good block register indicates absence of a bad memory cell, the data compressor skips reading of the pass/fail information stored in the address fail memory.

* * * * *